(12) United States Patent
Sun (10) Patent No.: US 6,781,467 B2
(45) Date of Patent: Aug. 24, 2004

(54) HIGH LINEARITY LOW NOISE AMPLIFIER

(75) Inventor: Bo Sun, Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/351,132

(22) Filed: Jan. 24, 2003

(65) Prior Publication Data

US 2004/0145415 A1 Jul. 29, 2004

(51) Int. Cl.[7] .............................. H03F 3/68; H03F 1/30
(52) U.S. Cl. ...................................... 330/295; 330/149
(58) Field of Search ................................. 330/295, 149

(56) References Cited

U.S. PATENT DOCUMENTS

| | | | |
|---|---|---|---|
| 5,477,370 A | * 12/1995 | Little et al. ................... | 398/202 |
| 5,508,657 A | * 4/1996 | Behan ........................... | 330/151 |
| 5,966,048 A | * 10/1999 | Thompson ..................... | 330/124 R |
| 6,107,878 A | * 8/2000 | Black ........................... | 330/129 |
| 6,175,279 B1 | * 1/2001 | Ciccarelli et al. ........... | 330/296 |

* cited by examiner

*Primary Examiner*—Patricia Nguyen
(74) *Attorney, Agent, or Firm*—Philip Wadsworth; Charles D. Brown; Howard H. Seo (57) ABSTRACT

A feedforward nonlinearity cancellation scheme is used to improve the linearity of a low noise amplifier (LNA). An LNA incorporates a main amplifier and an auxiliary amplifier couple to receive the same input. The outputs of the main amplifier and the auxiliary amplifier are also coupled. The auxiliary amplifier may be implemented as a very low power auxiliary amplifier having a very low linearity. The output of the auxiliary amplifier contains third-order intermodulation (IM3) products that are of similar amplitude, but opposite phase, to the IM3 products generated by the main amplifier. With the outputs of the main amplifier and the auxiliary amplifier coupled, their respective IM3 products are summed together and effectively cancel each other out. As a result, the output of the LNA contains substantially no IM3 products, and the linearity of the LNA is substantially improved.

25 Claims, 5 Drawing Sheets

HIGH LINEARITY LOW NOISE AMPLIFIER

FIELD OF THE INVENTION

The present invention relates generally to wireless communications. More particularly, the present invention relates to low noise amplifiers (LNAs) for use in wireless communication devices.

BACKGROUND

In wireless communication systems, a plurality of wireless communication devices (WCDs) communicate with one or more base stations within areas known as cells. A wireless communication system can include a variety of types of WCDs, including, for example, wireless telephones and devices having wireless communication capabilities, such as personal digital assistants (PDAs) and modems for use with laptop computers. Wireless communication functions can also be incorporated into other types of devices, such as automobiles. With wireless capabilities incorporated into an automobile design, a driver can obtain real-time, location-based traffic, weather, and navigation information, as well as roadside assistance and vehicle condition alerts.

Within each cell, several WCDs may communicate with a base station simultaneously using a single frequency band. Sharing of the frequency band can be accomplished using any of a variety of multiple access techniques. For example, some wireless communication systems use time division multiple access (TDMA) or Global System for Mobile (GSM) technologies in which WCDs communicate during allocated time slots. Some other wireless communication systems use other multiple access technologies, including, for example, frequency division multiple access (FDMA), amplitude companded single sideband (ACSSB) and other amplitude modulation (AM) schemes.

One technology that has enjoyed rapid growth is code division multiple access (CDMA). In CDMA systems, speech or data is converted to a digital form, which is then transmitted as a radio signal. Each call is distinguished by a unique code. In particular, each WCD uses a unique spreading code to modulate the signals it transmits and to demodulate the signals it receives. This code is added to the information data, e.g., the voice data, and modulated onto the carrier. An identical code is used in the receiver that is used to correlate the code with the carrier. The correlation process passes only data that matches the code. Thus, non-valid signals, e.g., signals from other users, are not decoded and appear as noise. As a result, minimal interference between WCDs is achieved. Accordingly, several WCDs can share a single frequency band. Further information regarding CDMA systems is set forth in the well-known IS-95 standard.

Many WCDs, such as wireless telephones, are battery-powered. For such WCDs, power consumption is an important design consideration. That is, it is desirable to reduce power consumption to the extent possible consistent with other design considerations. For example, the operating environment often dictates high performance for the RF front-end, particularly for CDMA systems, which receive and transmit simultaneously. High performance for the RF front-end is important because the presence of an interference signal as the transmit channel approaches its maximum power output generally causes cross-modulation of the transmit signal envelope. This results in "in-band" interference in the receive channel. Such in-band interference can result in degraded received signal quality, potentially resulting in dropped calls.

To maintain a tolerable level of cross-modulation, an IIP3 characteristic of an LNA or mixer channel can be adjusted to a high value. The IIP3 characteristic measures the signal strength at which the power of the third-order distortion energy of a gain stage is as strong as the fundamental signal energy. It can be shown that, simultaneously with a low noise figure, the low noise amplifier (LNA) should also have a very high IIP3 characteristic. See, e.g., V. Aparin, B. Butler, P. Draxler, "Cross Modulation Distortion in CDMA Receivers," *IEEE International Microwave Symposium,* Boston, June 2000. Using a high IIP3 value increases the linearity of an LNA or mixer channel, but also increases the bias current to the LNA or mixer channel. In a bipolar transistor LNA design, the IIP3 characteristic typically increases with increasing current consumption. However, the noise figure also increases at high currents. As a result, in some conventional implementations, a high IIP3 characteristic often results in a poor noise figure and excessive current consumption. High current consumption results in a high drain on battery power, thus reducing both talk and standby time for a wireless telephone.

Several conventional techniques have been offered to obtain a higher IIP3 characteristic without sacrificing the noise figure or current consumption. For example, at RF frequencies, the IIP3 characteristic is strongly affected by the presence of low-frequency distortion products. See, e.g., V. Aparin, C. Persico, "Effect of Out-of-Band Termination on Intermodulation Distortion in Common-Emitter Circuits," IEEE MTT-S Dig., vol. 3, June 1999, pp. 977–980. In a two-tone test, nonlinearities will cause the generation of several mixing products. When two signals with different frequencies f1 and f2 are applied to a nonlinear system, the output will typically exhibit some components that are not harmonics of the input frequencies f1 and f2. One such component is attributable to a phenomenon known as intermodulation (IM).

Intermodulation results from mixing or multiplication of the two signals when their sum is raised to a power greater than unity. For example, one intermodulation mixing product occurs at the frequency (f1−f2). This can be viewed as a low-frequency modulation of the operating point. Due to unavoidable internal feedback inside the transistor as well as external feedback, the (f1−f2) product will mix again with f1 and f2, thus creating in-band distortion products at the IM3 (third-order intermodulation) frequencies (f1−f2)+f1=2*f1−f2 and (f2−f1)+f2=2*f2−f1. These IM3 products are a particularly significant source of distortion in RF systems. If a weak signal accompanied by two strong interference sources experiences third-order nonlinearity, then one of the intermodulation products falls in the band of interest, corrupting the desired component. In order to obtain a high IIP3 characteristic, it is beneficial to ensure that a low impedance is presented to these IM3 products, essentially shorting them out.

SUMMARY OF THE INVENTION

According to various embodiments, a feedforward nonlinearity cancellation scheme is used to improve the linearity of a low noise amplifier (LNA). An LNA incorporates a main amplifier and an auxiliary amplifier. The auxiliary amplifier may be implemented as a very low power auxiliary amplifier having a very low linearity. The auxiliary amplifier is coupled to receive the same input signal as the main amplifier. The outputs of the main amplifier and the auxiliary amplifier are also coupled. The output of the auxiliary amplifier contains third-order intermodulation (IM3) products that are of similar amplitude, but opposite phase, to the IM3 products generated by the main amplifier. With the outputs of the main amplifier and the auxiliary amplifier coupled, their respective IM3 products are summed together and effectively cancel each other out. As a result, the output of the LNA contains substantially no IM3 products, and the linearity of the LNA is substantially improved.

In one embodiment, a low noise amplifier includes first and second amplifiers coupled to receive an input RF signal. The first amplifier generates a first output signal as a function of the RF input signal. The first output signal has a first intermodulation component. The second amplifier, which is coupled to the first amplifier, generates a second output signal as a function of the RF input signal. The second output signal has a second intermodulation component that has substantially similar amplitude and substantially opposite phase to the first intermodulation component. The first and second amplifiers are arranged, e.g., AC coupled, to generate a third output signal as a function of a sum of the first and second output signals. The first and second intermodulation components substantially cancel each other.

In another embodiment, an integrated circuit includes first and second amplifiers coupled to receive an input RF signal. The first amplifier generates a first output signal as a function of the RF input signal. The first output signal has a first intermodulation component. The second amplifier, which is coupled to the first amplifier, generates a second output signal as a function of the RF input signal. The second output signal has a second intermodulation component that has substantially similar amplitude and substantially opposite phase to the first intermodulation component. The first and second amplifiers are arranged, e.g., AC coupled, to generate a third output signal as a function of a sum of the first and second output signals. The first and second intermodulation components substantially cancel each other.

In still another embodiment, a wireless communication device (WCD) includes an antenna arranged to receive an RF signal. A first amplifier is operatively coupled to the antenna and generates a first output signal as a function of the RF signal. The first output signal has a first intermodulation component. A second amplifier is coupled to the first amplifier and generates a second output signal as a function of the RF signal. The second output signal has a second intermodulation component of substantially similar amplitude and substantially opposite phase to the first intermodulation component. The first and second amplifiers are arranged, e.g., AC coupled, to generate a third output signal as a function of a sum of the first and second output signals. The first and second intermodulation components substantially canceling each other. A downconversion arrangement is coupled to the first and second amplifiers and generates a baseband signal as a function of the third output signal. A demodulator arrangement is coupled to the downconversion arrangement and demodulates the baseband signal.

In yet another embodiment, a method to generate an amplified signal includes receiving an RF signal. A first output signal is generated as a function of the RF signal. The first output signal has a first intermodulation component. A second second output signal is generated as a function of the RF signal. The second output signal has a second intermodulation component of substantially similar amplitude and substantially opposite phase to the first intermodulation component The amplified signal is generated as a function of a sum of the first and second output signals. The first and second intermodulation components substantially cancel each other. This method may be embodied in a low noise amplifier.

BRIEF DESCRIPTION OF THE DRAWINGS

The present invention will now be described, by way of example, with reference to the accompanying drawings, in which.

DESCRIPTION OF VARIOUS EMBODIMENTS

According to various embodiments, a low noise amplifier (LNA) uses a feedforward nonlinearity cancellation scheme for improved linearity. The LNA incorporates a main amplifier and an auxiliary amplifier. The auxiliary amplifier may be implemented as a very low power auxiliary amplifier having a very low linearity. For example, the IIP3 and gain of the auxiliary amplifier may be approximately two orders of magnitude lower relative to the main amplifier. Both the inputs and the outputs of the auxiliary amplifier and main amplifier are AC coupled.

The auxiliary amplifier and the main amplifier may receive a two-tone input signal having components at two frequencies f1 and f2. In response to this input signal, the main amplifier and the auxiliary amplifier each generate an output signal having components at the two frequencies f1 and f2. The output signals thus generated also contain third-order intermodulation (IM3) products at the frequencies (2f1−f2) and (2f2−f1). The gain of the auxiliary amplifier is much smaller than the gain of the main amplifier. As a result, the components at the frequencies f1 and f2 generated by the auxiliary amplifier are negligible relative to the output of the main amplifier. On the other hand, the auxiliary amplifier is much more nonlinear than the main amplifier. Thus, the IM3 products generated by the auxiliary amplifier are of similar amplitude but opposite phase relative to the IM3 products generated by the main amplifier. With the outputs of the main amplifier and the auxiliary amplifier coupled, their respective IM3 products are summed together and effectively cancel each other out. As a result, the output of the LNA contains substantially no IM3 products, and the linearity of the LNA is substantially improved. The LNA can be incorporated as part of a wireless communication device (WCD), which can in turn form part of a wireless communication system.

Figure 1:
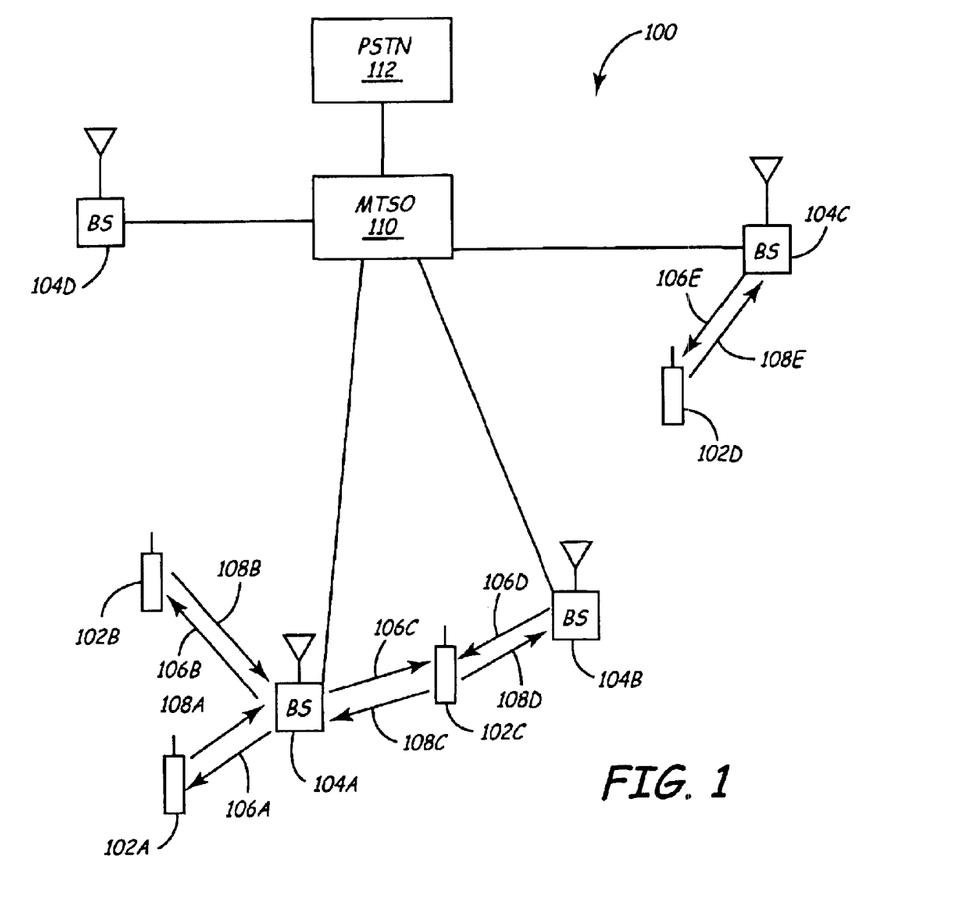
FIG. 1 is a system diagram illustrating an example wireless communication system according to an embodiment.

FIG. 1 is a system diagram illustrating an example wireless communication system 100 according to an embodiment. In particular, the wireless communication system 100 is depicted as a wireless telephone network. However, it will be appreciated by those skilled in the art that the principles disclosed herein are equally applicable to wireless communication systems in which LNAs are employed to amplify received radio frequency (RF) signals. The wireless telephone network shown in FIG. 1 may be configured for use in CDMA communications according to any of a number of standards, including, for example, the IS-95 standard, the CDMA2000 standard, and the WCDMA standard. The wireless communication system 100 may also be configured for use in GSM or GPRS communications.

During operation, wireless communication devices (WCDs) 102A–D conduct wireless communication by establishing one or more RF interfaces with one or more base stations 104A–D using modulated RF signals. WCDs 102A–D are depicted in FIG. 1 as wireless telephones communicating using a CDMA protocol. Those skilled in the art will understand that any or all of WCDs 102A–D may be implemented as wireless telephones that use other protocols, such as the GSM standard. Further, any or all of WCDs 102A–D may be implemented as other types of WCDs, including, for example, personal digital assistants (PDAs) with wireless capabilities and wireless modems for use with laptop computers. Wireless communication functions can also be incorporated into other types of devices, such as automobiles.

Each RF interface between a base station 104 and a WCD 102 includes a forward link 106, or downlink, from the base station 104 to the WCD 102 and a reverse link 108, or uplink, from the WCD 102 to the base station 104. Using these RF interfaces, a call with another user may be conducted via a mobile telephone switching office (MTSO) 110 and a public switch telephone network (PSTN) 112. The links between the base stations 104, the MTSO 110, and the PSTN 112 may be formed via either wired connections or wireless connections, such as microwave links.

As described above, each WCD 102 receives an RF signal from one or more base stations 104 via a forward link 106. This RF signal is relatively low in power. Accordingly, an LNA forming part of the WCD 102 amplifies the received RF signal so that the WCD 102 can downconvert the received RF signal to baseband signals, e.g., in-phase (I) and quadrature (Q) baseband signals for CDMA. The baseband signals are then demodulated by a modem to extract the voice or data signal carried by the RF signal.

High performance for the RF front-end, including the LNA, is important to prevent cross-modulation of the transmit signal envelope and resulting degradation in received signal quality. To improve the performance of the RF front-end, the WCD 102 incorporates an LNA with a high linearity. In particular, the LNA uses a feedforward nonlinearity cancellation scheme. As described below in connection with FIG. 3, the LNA incorporates a main amplifier and an auxiliary amplifier. Both the inputs and the outputs of the auxiliary amplifier and the main amplifier are AC coupled. That is, the input of the auxiliary amplifier is AC coupled to the input of the main amplifier, and the output of the auxiliary amplifier is AC coupled to the output of the main amplifier.

The auxiliary amplifier may be implemented as a very low power auxiliary amplifier having a very low linearity. Because the auxiliary amplifier is much more nonlinear than the main amplifier, the auxiliary amplifier generates third-order intermodulation (IM3) products that are of similar amplitude relative to the IM3 products generated by the main amplifier. However, the IM3 products generated by the auxiliary amplifier are of substantially opposite phase to the IM3 products generated by the main amplifier. As a result, with the outputs of the main amplifier and the auxiliary amplifier coupled, their respective IM3 products are summed together and effectively cancel each other out. Thus, the output of the LNA contains substantially no IM3 products, and the linearity of the LNA is substantially improved, as is the overall performance of the RF front-end. Degradation of received signal quality is thus substantially avoided, thereby reducing the incidence of dropped calls.

Figure 2:
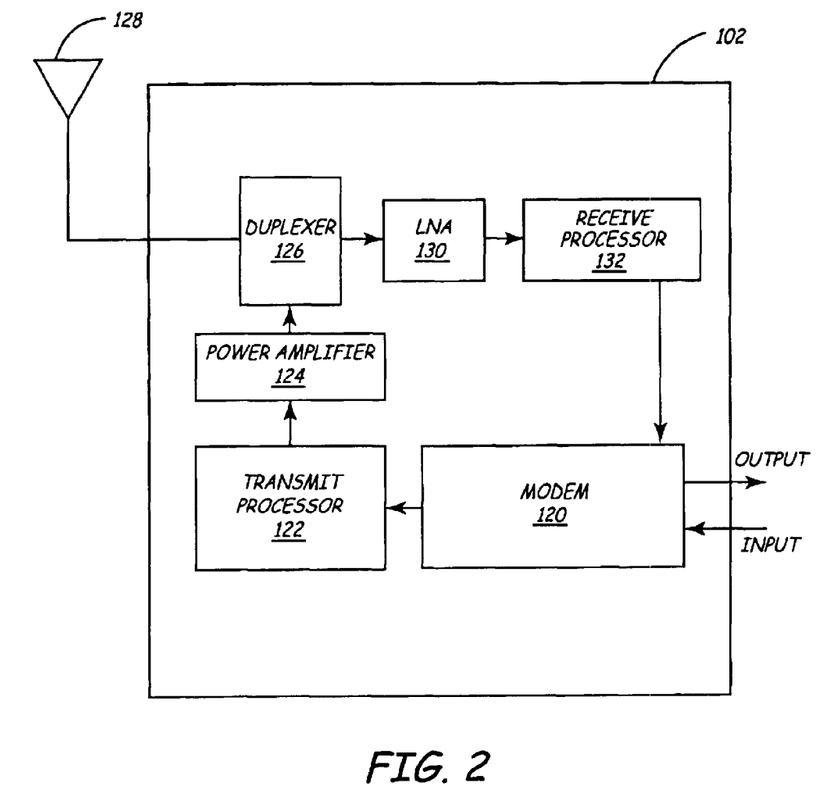
FIG. 2 is a block diagram illustrating an example wireless communication device according to another embodiment.

FIG. 2 is a block diagram illustrating an example wireless communication device (WCD) 102. The WCD 102 uses a transmit signal path and a receive signal path. In the transmit signal path, a modem 120 receives an input signal from an encoder (not shown) that encodes user input, for example, from a microphone or a keypad. The modem 120 uses quadrature phase shift keying (QPSK) to modulate the user input using a spreading code unique to the WCD 102. As a result of the modulation process, the modem 120 generates in-phase (I) and quadrature (Q) baseband signals. A transmit processor 122 performs baseband-to-RF signal processing to produce an RF signal to be transmitted by the WCD 102. In particular, the transmit processor 122 upconverts the baseband quadrature signals to an RF signal in the CDMA frequency band and amplifies the baseband quadrature signals to provide signal drive capability to a power amplifier 124. The baseband quadrature signals may first be upconverted to an intermediate frequency (IF) before being upconverted to the CDMA frequency band. Alternatively, the baseband quadrature signals may be upconverted directly to the CDMA frequency band without first being upconverted to the intermediate frequency. In either case, the power amplifier 124 further amplifies the RF signal and provides the amplified signal to a duplexer 126. The duplexer 126 then provides the RF signal to an antenna 128, which transmits the RF signal.

In the receive signal path, the duplexer 126 receives an RF signal. Because the RF signal is of relatively low power compared to the baseband signals, a low noise amplifier (LNA) 130 amplifies the RF signal. A receive processor 132 then performs RF-to-baseband signal processing to produce baseband quadrature signals to be demodulated by the modem 120. In particular, the receive processor 132 downconverts the RF signal to in-phase (I) and quadrature (Q) baseband signals. The RF signal may first be downconverted to an intermediate frequency (IF) before being downconverted to the baseband frequency. Alternatively, the RF signal may be downconverted directly to the baseband frequency without first being downconverted to the intermediate frequency. In either case, the modem 120 demodulates the baseband quadrature signals to produce an output signal that is decoded and provided to an output device, e.g., a speaker or a display screen.

With the received RF signal having low power, it is important that the RF front-end, including the LNA 130, exhibit a high degree of linearity. High performance is important to prevent cross-modulation of the transmit signal envelope and, as a result, to prevent degradation in received signal quality. Accordingly, the LNA 130 uses a feedforward nonlinearity cancellation scheme to improve linearity. Specifically, the LNA 130 incorporates a main amplifier and an auxiliary amplifier. The auxiliary amplifier has a very low gain and very low linearity compared to the main amplifier. For example, in some implementations, the gain and linearity of the auxiliary amplifier may be two orders of magnitude lower relative to the main amplifier. As a result, the auxiliary amplifier can be configured to generate third-order intermodulation (IM3) products that are of similar amplitude, but opposite phase, relative to the IM3 products generated by the main amplifier. With the outputs of the main amplifier and the auxiliary amplifier coupled, their respective IM3 products are summed together and cancel each other out. Thus, the output of the LNA 130 contains substantially no IM3 products, and the linearity of the LNA 130 is substantially improved, as is the overall performance of the RF front-end. Because the gain of the auxiliary amplifier is much lower than the gain of the main amplifier, the components of the output at the frequencies f1 and f2 generated by the auxiliary amplifier are negligible relative to the output of the main amplifier.

Figure 3:
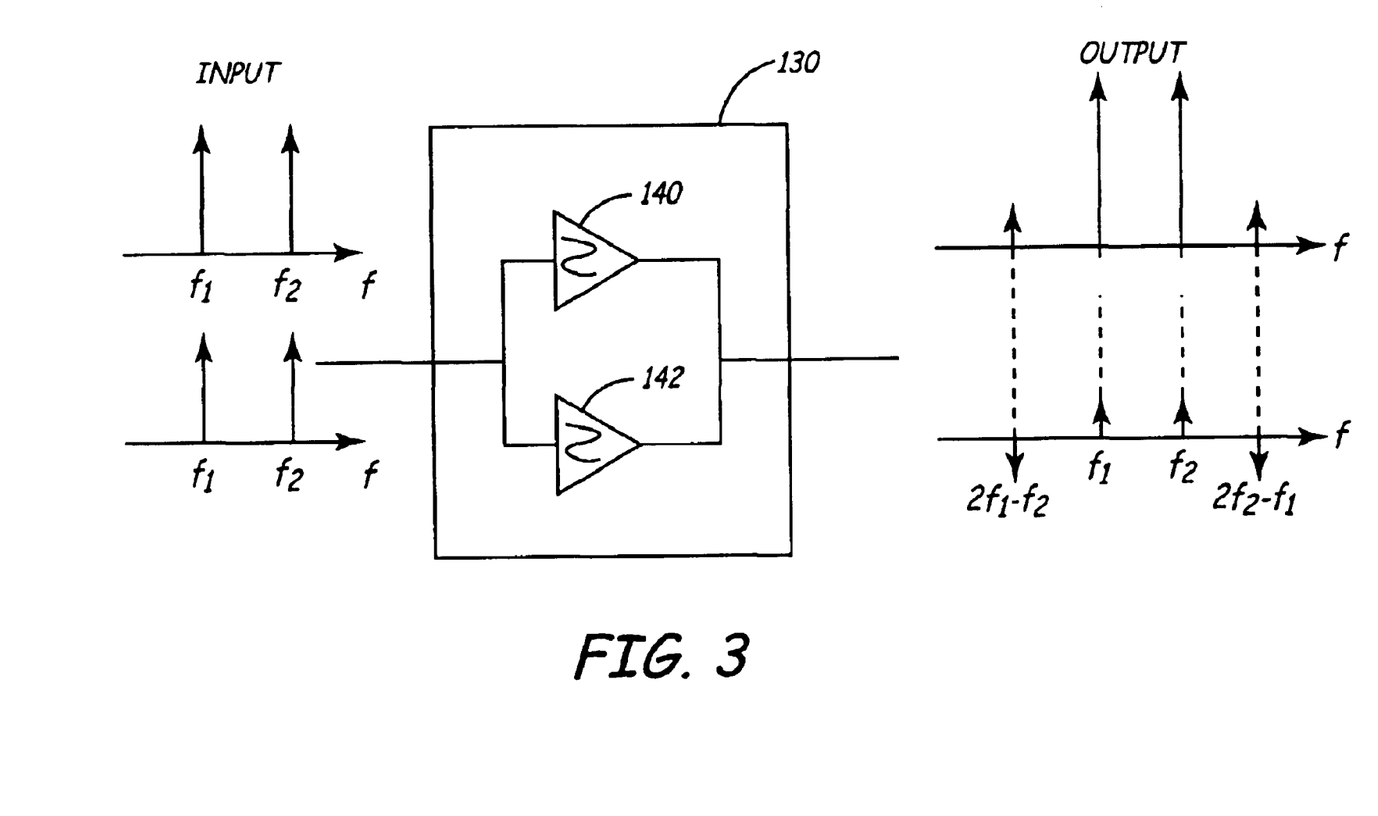
FIG. 3 is a block diagram illustrating an example low noise amplifier with an example two-tone input and corresponding output.

FIG. 3 is a block diagram illustrating an example implementation of the low noise amplifier (LNA) 130 with an example two-tone input and corresponding output. The LNA 130 includes a main amplifier 140 and an auxiliary amplifier 142. The inputs of the main amplifier 140 and the auxiliary amplifier 142 are AC coupled such that the main amplifier 140 and the auxiliary amplifier 142 receive identical input signals. In addition, the outputs of the main amplifier 140 and the auxiliary amplifier 142 are also AC coupled such that the output of the LNA 130 is the sum of the outputs of the main amplifier 140 and the auxiliary amplifier 142.

In a CDMA system, it is important that the LNA 130 exhibit highly linear performance. One measure of linearity is the IIP3 characteristic. According to an embodiment, the main amplifier 140 and the auxiliary amplifier 142 are arranged so as to form a feedforward circuit to improve the IIP3 characteristic of the LNA 130. Specifically, the auxiliary amplifier 142 is implemented as a very low power auxiliary amplifier having a very low linearity. For example, the IIP3 and gain of the auxiliary amplifier 142 may be approximately two orders of magnitude lower than the main amplifier 140. With the IIP3 and gain of the auxiliary amplifier 142 much lower than the IIP3 of the main amplifier 140, the third-order intermodulation (IM3) products generated by the auxiliary amplifier 142 are substantially similar in amplitude compared to the IM3 products generated by the main amplifier 140. The main amplifier 140 and the auxiliary amplifier 142 are arranged such that the IM3 products they generate are substantially 180° out-of-phase relative to each other. As a result, when the outputs of the main amplifier 140 and the auxiliary amplifier 142 are summed, their respective IM3 products cancel each other. Consequently, the output of the LNA 130 contains nearly no IM3 products and is highly linear.

By way of illustration, the main amplifier 140 and the auxiliary amplifier 142 are depicted in FIG. 3 as receiving a two-tone input signal having components at two frequencies f1 and f2. In response to this two-tone input signal, the main amplifier 140 and the auxiliary amplifier 142 each generate an output signal having components at the two frequencies f1 and f2. The output signals thus generated also contain third-order intermodulation (IM3) products at the frequencies (2f1–f2) and (2f2–f1). With the gain of the auxiliary amplifier 142 much lower than that of the main amplifier 140, the components at the frequencies f1 and f2 generated by the auxiliary amplifier 142 are negligible relative to the output of the main amplifier 140. Because the auxiliary amplifier 142 is much more nonlinear than the main amplifier 140, however, the auxiliary amplifier 142 generates IM3 products with similar amplitude to the IM3 products generated by the main amplifier 140. Thus, the IM3 products in the combined outputs of the main amplifier 140 and the auxiliary amplifier 142 cancel each other, increasing the linearity of the LNA 130.

In one implementation, the main amplifier 140 is a common emitter amplifier with inductive degeneration for high linearity. By contrast, the auxiliary amplifier 142 is implemented as a two-stage common emitter that is much more nonlinear than the main amplifier 140 and that has a much smaller gain than the main amplifier 140. In addition, the auxiliary amplifier 142 is configured so as to ensure that the IM3 products that it generates are 180° out of phase relative to the IM3 products generated by the main amplifier 140. Because the auxiliary amplifier 142 includes only a few transistors and resistors, the impact of the auxiliary amplifier 142 on the device size and power consumption of the LNA 130 is minimal.

Figure 4:
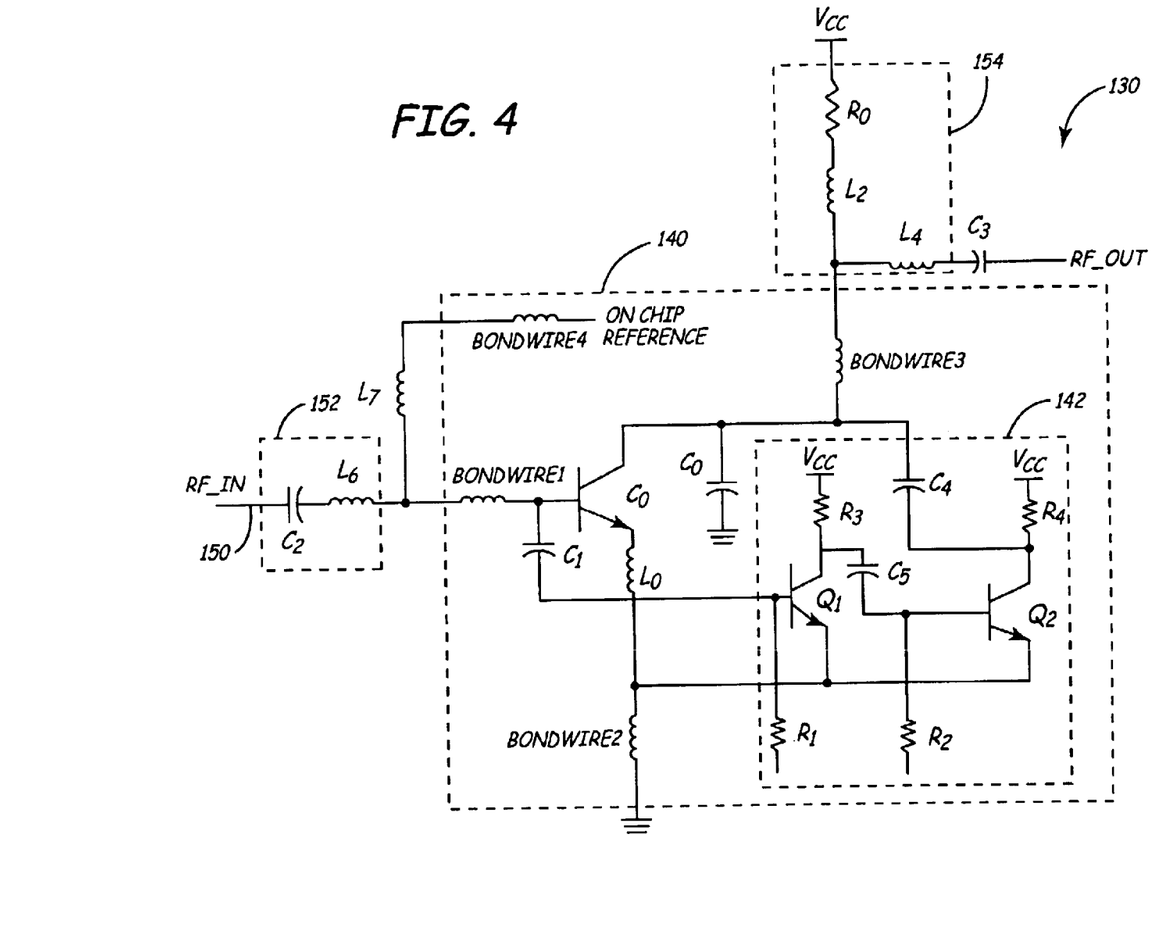
FIG. 4 is a schematic diagram illustrating an example implementation of the low noise amplifier depicted in FIG. 3.

FIG. 4 is a schematic diagram illustrating an example implementation of the LNA 130 depicted in FIG. 3. The LNA 130 can be formed on an integrated circuit (IC), such as an application specific integrated circuit (ASIC). The main amplifier 140 receives an RF signal at an input 150. A capacitor $C_2$ and an inductor $L_6$ form an input matching network 152. An inductor $L_7$ serves as an external RF choke that blocks the RF signal and passes a DC signal to provide an on-chip reference. A resistor $R_0$ and inductors $L_2$ and $L_4$ form an external matching network 154 through which the supply voltage $V_{CC}$ is supplied. The main amplifier 140 itself includes a transistor $Q_0$ and an on-chip degeneration inductor $L_0$ arranged in a single common emitter stage architecture that provides a high IIP3 characteristic and a high noise figure.

The auxiliary amplifier 142 includes a two-stage common emitter amplifier arranged in parallel to the main amplifier 140 so as to provide nonlinearity cancellation. The first stage of the auxiliary amplifier 142 is formed by a transistor $Q_1$, and resistors $R_1$ and $R_3$. The second stage of the auxiliary amplifier 142 is formed by a transistor $Q_2$ and resistors $R_2$ and $R_4$. The first and second stages of the auxiliary amplifier 142 are AC coupled together via a capacitor $C_5$. Capacitors $C_1$ and $C_4$ collectively provide nonlinearity cancellation by ensuring that the IM3 products generated by the auxiliary amplifier 142 are 180° out-of-phase relative to the IM3 products generated by the main amplifier 140. While not shown, the capacitor $C_1$ may be replaced by a passive RC phase shifter.

Figure 5:
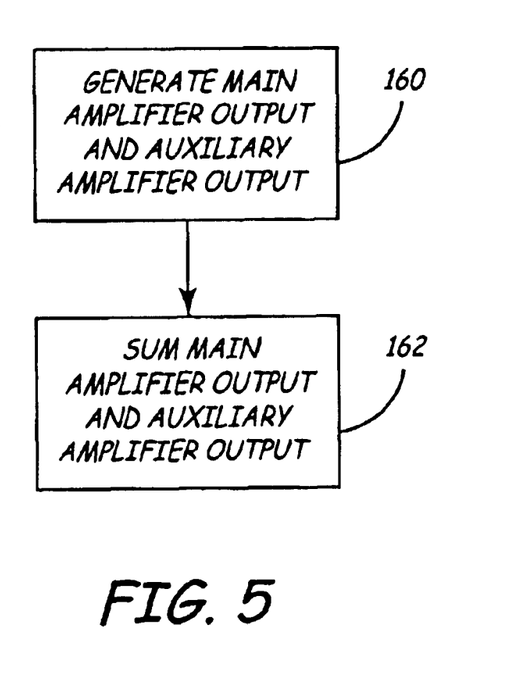
FIG. 5 is a flow diagram illustrating nonlinearity cancellation according to still another embodiment.

FIG. 5 is a flow diagram illustrating nonlinearity cancellation according to still another embodiment. The main amplifier 140 and the auxiliary amplifier 142 each generate an output signal (160). As described above, the output signals each contain third-order intermodulation (IM3) products. Because the gain and linearity of the auxiliary amplifier 142 are much lower compared to the main amplifier 140, the auxiliary amplifier 142 generates IM3 products that are of comparable amplitude to the IM3 products generated by the main amplifier 142. The capacitors $C_1$ and $C_4$ of FIG. 4 ensure that the IM3 products generated by the auxiliary amplifier 142 are 180° out-of-phase relative to the IM3 products generated by the main amplifier 140.

With the outputs of the main amplifier 140 and the auxiliary amplifier 142 AC coupled, the output signals generated by the main amplifier 140 and the auxiliary amplifier 142 are summed (162). Because the IM3 products generated by the main amplifier 140 and the auxiliary amplifier 142 are of similar amplitude but opposite phase, they cancel each other when the output signals are summed. Accordingly, the IM3 products are substantially eliminated from the output of the LNA 130.

As shown in the foregoing description, the feedforward nonlinearity cancellation scheme may result in improved linearity for an LNA. For example, the IIP3 of the LNA can be improved by approximately 10 dB with an insignificant increase in current draw. Alternatively, the LNA can realize similar linearity to prior art LNAs with significantly lower current draw. In addition, the auxiliary amplifier described above includes only a few transistors and resistors and therefore impacts device size only minimally.

The foregoing description of various embodiments is provided to enable any person skilled in the art to practice the present invention. Various modifications to these embodiments will be readily apparent to those skilled in the art, and the general principles described herein may be applied to other embodiments without the use of the inventive faculty. Accordingly, the present invention is not intended to be limited to the embodiments expressly described herein, but is to be accorded the widest scope consistent with the principles and novel features disclosed herein.

What is claimed is:

1. A low noise amplifier comprising:

a first amplifier coupled to receive an input RF signal and configured to generate a first output signal as a function of the RF input signal, the first output signal having a first intermodulation component; and a second amplifier coupled to the first amplifier and configured to generate a second output signal as a function of the RF signal, the second output signal having a second intermodulation component of substantially similar amplitude and substantially opposite phase to the first intermodulation component, the first and second amplifiers arranged to generate a third output signal as a function of a sum of the first and second output signals, the first and second intermodulation components substantially canceling each other, wherein a gain of the second amplifier is lower than a gain of the first amplifier.

2. The low noise amplifier of claim 1, wherein the first amplifier comprises a single common emitter stage amplifier.

3. The low noise amplifier of claim 1, wherein the second amplifier comprises a two-stage common emitter amplifier.

4. The low noise amplifier of claim 1, wherein the first and second intermodulation components comprise third-order intermodulation (IM3) components.

5. The low noise amplifier of claim 1, wherein the gain of the second amplifier is substantially two orders of magnitude lower than the gain of the first amplifier.

6. The low noise amplifier of claim 1, wherein a linearity characteristic of the second amplifier is lower than linearity characteristic of the first amplifier.

7. The low noise amplifier of claim 6, wherein the linearity characteristic of the second amplifier is substantially two orders of magnitude lower than linearity characteristic of the first amplifier.

8. An integrated circuit comprising:

a first amplifier coupled to receive an input RF signal and configured to generate a first output signal as a function of the RF input signal, the first output signal having a first intermodulation component; and a second amplifier coupled to the first amplifier and configured to generate a second output signal as a function of the RF input signal, the second output signal having a second intermodulation component of substantially similar amplitude and substantially opposite phase to the first intermodulation component, the first and second amplifiers arranged to generate a third output signal as a function of a sum of the first and second output signals, the first and second intermodulation components substantially canceling each other, wherein a gain of the second amplifier is lower than a gain of the first amplifier.

9. The integrated circuit of claim 8, wherein the first amplifier comprises a single common emitter stage amplifier.

10. The integrated circuit of claim 8, wherein the second amplifier comprises a two-stage common emitter amplifier.

11. The integrated circuit of claim 8, wherein the first and second intermodulation components comprise third-order intermodulation (IM3) components.

12. The integrated circuit of claim 8, wherein the gain of the second amplifier is substantially two orders of magnitude lower than the gain of the first amplifier.

13. The integrated circuit of claim 8, wherein a linearity characteristic of the second amplifier is lower than linearity characteristic of the first amplifier.

14. The integrated circuit of claim 13, wherein the linearity characteristic of the second amplifier is substantially two orders of magnitude lower than the linearity characteristic of the first amplifier.

15. The integrated circuit of claim 8, wherein the integrated circuit comprises an application specific integrated circuit (ASIC).

16. A wireless communication device comprising:

an antenna arranged to receive an RF signal;

a first amplifier operatively coupled to antenna and configured to generate a first output signal as a function of the RF signal, the first output signal having a first intermodulation component;

a second amplifier coupled to the first amplifier and configured to generate a second output signal as a function of the RF signal, the second output signal having a second intermodulation component of substantially similar amplitude and substantially opposite phase to the first intermodulation component, the first and second amplifiers arranged to generate a third output signal as a function of a sum of the first and second output signals, the first and second intermodulation components substantially canceling each other;

a downconversion arrangement coupled to the first and second amplifiers and configured to generate a baseband signal as a function of the third output signal; and a demodulator arrangement coupled to the downconversion arrangement and configured to demodulate the baseband signal, wherein a gain of the second amplifier is lower than a gain of the first amplifier.

17. The wireless communication device of claim 16 wherein the first amplifier comprises a single common emitter stage amplifier.

18. The wireless communication device of claim 16, wherein the second amplifier comprises a two-stage common emitter amplifier.

19. The wireless communication device of claim 16, wherein the first and second intermodulation components comprise third-order intermodulation (IM3) components.

20. The wireless communication device of claim 16, wherein the gain of the second amplifier is substantially two orders of magnitude lower than the gain of the first amplifier.

21. The wireless communication device of claim 16, wherein a linearity characteristic of the second amplifier is lower than a linearity characteristic of the first amplifier.

22. The wireless communication device of claim 21, wherein the linearity characteristic of the second amplifier is substantially two order of magnitude lower than the linearity characteristic of the first amplifier.

23. The wireless communication device of claim 16, wherein the baseband signal is a CDMA quadrature baseband signal.

24. The wireless communication device of claim 16, wherein the wireless communication device comprises at least one of a wireless telephone, a personal digital assistant (PDA), a wireless modem, and an automobile.

25. A low noise amplifier, comprising:

means for receiving an RF signal;

means for generating a first output signal as a function of the RF signal, the first output signal having a first intermodulation component;

means for generating a second output signal as a function of the RF signal, the second output signal having a second intermodulation component of substantially similar amplitude and substantially opposite phase to first intermodulation component; and means for generating signal as a function of a sum of the first and second output signals, the first and second intermodulation components substantially canceling each other, wherein a gain of the means for generating a second output signal is lower than a gain of the means for generating a first output signal.

* * * * *